(12) United States Patent
Timmermans et al.

(10) Patent No.: US 9,222,626 B1
(45) Date of Patent: *Dec. 29, 2015

(54) LIGHT TUBE AND POWER SUPPLY CIRCUIT

(71) Applicant: iLumisys, Inc., Troy, MI (US)

(72) Inventors: Jos Timmermans, Ortonville, MI (US);
Jean C. Raymond, Nominique (CA);
John Ivey, Farmington Hills, MI (US)

(73) Assignee: ILUMISYS, INC., Troy, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/669,963

(22) Filed: Mar. 26, 2015

Related U.S. Application Data

(63) Continuation of application No. 14/299,909, filed on Jun. 9, 2014, now Pat. No. 9,006,990, and a continuation of application No. 14/299,915, filed on Jun. 9, 2014, now Pat. No. 9,006,993, said application (Continued)

(51) Int. Cl.
*F21S 4/00* (2006.01)
*F21K 99/00* (2010.01)
*H05B 33/08* (2006.01)
(Continued)

(52) U.S. Cl.
CPC ............... *F21K 9/175* (2013.01); *F21V 23/009* (2013.01); *H05B 33/0815* (2013.01); *H05B 33/0845* (2013.01); *F21Y 2103/003* (2013.01)

(58) Field of Classification Search
USPC ........... 362/249.01, 249.02, 260, 285, 185 R, 362/185 S, 312, 246
See application file for complete search history.

(56) References Cited

U.S. PATENT DOCUMENTS

D84,763 S    7/1931   Strange
D119,797 S   4/1940   Winkler et al.
(Continued)

FOREIGN PATENT DOCUMENTS

DE    29900320 U1    5/1995
DE    196 51 140 A1  6/1997
(Continued)

OTHER PUBLICATIONS

Defendant's Invalidity Contentions in *Altair Engineering, Inc.* v. *LEDS America, Inc.*, Civil Case No. 2:10-CV-13424 (E. D. Mich.)(J. O'Meara)(Feb. 4, 2011).

(Continued)

*Primary Examiner* — Minh D A
(74) *Attorney, Agent, or Firm* — Young, Basile, Hanlon & Macfarlane, P.C.

(57) ABSTRACT

A replacement light tube for replacing a fluorescent light tube includes an elongate tubular housing having first and second ends, first and second end caps disposed thereon, each configured to fit with a socket for the fluorescent light tube, and a rigid support structure having a planar portion having a first surface extending within the elongate tubular housing between the first and second ends and having spaced-apart sidewalls extending away from the first surface and extending within the housing between the first and second ends. At least a portion of the sidewalls are in contact with an interior surface of housing. A plurality of white light emitting diodes are supported only by a second surface of the planar portion opposite to the first surface and between the first and second ends, and are arranged to emit light through the housing.

30 Claims, 9 Drawing Sheets

Related U.S. Application Data

No. 14/299,909 is a continuation of application No. 13/777,331, filed on Feb. 26, 2013, now Pat. No. 8,866,396, said application No. 14/299,915 is a continuation of application No. 13/777,331, which is a continuation of application No. 12/965,019, filed on Dec. 10, 2010, now Pat. No. 8,382,327, which is a continuation of application No. 11/085,744, filed on Mar. 21, 2005, now Pat. No. 8,247,985, which is a continuation of application No. 09/782,375, filed on Feb. 12, 2001, now Pat. No. 7,049,761.

(60) Provisional application No. 60/181,744, filed on Feb. 11, 2000.

(51) Int. Cl.
*F21V 23/00* (2015.01)
*F21Y 103/00* (2006.01)

(56) References Cited

U.S. PATENT DOCUMENTS

| | | |
|---|---|---|
| D125,312 S | 2/1941 | Logan |
| 2,826,679 A | 3/1958 | Rosenberg |
| 2,909,097 A | 10/1959 | Alden et al. |
| 3,178,622 A | 4/1965 | Paul et al. |
| 3,272,977 A | 9/1966 | Holmes |
| 3,318,185 A | 5/1967 | Kott |
| 3,561,719 A | 2/1971 | Grindle |
| 3,586,936 A | 6/1971 | McLeroy |
| 3,601,621 A | 8/1971 | Ritchie |
| 3,612,855 A | 10/1971 | Juhnke |
| 3,643,088 A | 2/1972 | Osteen et al. |
| 3,739,336 A | 6/1973 | Burland |
| 3,746,918 A | 7/1973 | Drucker et al. |
| 3,818,216 A | 6/1974 | Larraburu |
| 3,821,590 A | 6/1974 | Kosman et al. |
| 3,832,503 A | 8/1974 | Crane |
| 3,858,086 A | 12/1974 | Anderson et al. |
| 3,909,670 A | 9/1975 | Wakamatsu et al. |
| 3,924,120 A | 12/1975 | Cox, III |
| 3,958,885 A | 5/1976 | Stockinger et al. |
| 3,969,720 A | 7/1976 | Nishino |
| 3,974,637 A | 8/1976 | Bergey et al. |
| 3,993,386 A | 11/1976 | Rowe |
| 4,001,571 A | 1/1977 | Martin |
| 4,009,394 A | 2/1977 | Mierzwinski |
| 4,054,814 A | 10/1977 | Fegley et al. |
| 4,070,568 A | 1/1978 | Gala |
| 4,082,395 A | 4/1978 | Donato et al. |
| 4,096,349 A | 6/1978 | Donato |
| 4,102,558 A | 7/1978 | Krachman |
| 4,107,581 A | 8/1978 | Abernethy |
| 4,189,663 A | 2/1980 | Schmutzer et al. |
| 4,211,955 A | 7/1980 | Ray |
| 4,241,295 A | 12/1980 | Williams, Jr. |
| 4,257,672 A | 3/1981 | Balliet |
| 4,261,029 A | 4/1981 | Mousset |
| 4,262,255 A | 4/1981 | Kokei et al. |
| 4,271,408 A | 6/1981 | Teshima et al. |
| 4,271,458 A | 6/1981 | George, Jr. |
| 4,272,689 A | 6/1981 | Crosby et al. |
| 4,273,999 A | 6/1981 | Pierpoint |
| 4,298,869 A | 11/1981 | Okuno |
| 4,329,625 A | 5/1982 | Nishizawa et al. |
| 4,339,788 A | 7/1982 | White et al. |
| 4,342,947 A | 8/1982 | Bloyd |
| 4,344,117 A | 8/1982 | Niccum |
| 4,367,464 A | 1/1983 | Kurahashi et al. |
| D268,134 S | 3/1983 | Zurcher |
| 4,382,272 A | 5/1983 | Quella et al. |
| 4,388,567 A | 6/1983 | Yamazaki et al. |
| 4,388,589 A | 6/1983 | Molldrem, Jr. |
| 4,392,187 A | 7/1983 | Bornhorst |
| 4,394,719 A | 7/1983 | Moberg |
| 4,420,711 A | 12/1983 | Takahashi et al. |
| 4,455,562 A | 6/1984 | Dolan et al. |
| 4,500,796 A | 2/1985 | Quin |
| 4,521,835 A | 6/1985 | Meggs et al. |
| 4,531,114 A | 7/1985 | Topol et al. |
| 4,581,687 A | 4/1986 | Nakanishi |
| 4,597,033 A | 6/1986 | Meggs et al. |
| 4,600,972 A | 7/1986 | MacIntyre |
| 4,607,317 A | 8/1986 | Lin |
| 4,622,881 A | 11/1986 | Rand |
| 4,625,152 A | 11/1986 | Nakai |
| 4,635,052 A | 1/1987 | Aoike et al. |
| 4,647,217 A | 3/1987 | Havel |
| 4,650,971 A | 3/1987 | Manecci et al. |
| 4,656,398 A | 4/1987 | Michael et al. |
| 4,661,890 A | 4/1987 | Watanabe et al. |
| 4,668,895 A | 5/1987 | Schneiter |
| 4,669,033 A | 5/1987 | Lee |
| 4,675,575 A | 6/1987 | Smith et al. |
| 4,682,079 A | 7/1987 | Sanders et al. |
| 4,686,425 A | 8/1987 | Havel |
| 4,687,340 A | 8/1987 | Havel |
| 4,688,154 A | 8/1987 | Nilssen |
| 4,688,869 A | 8/1987 | Kelly |
| 4,695,769 A | 9/1987 | Schweickardt |
| 4,698,730 A | 10/1987 | Sakai et al. |
| 4,701,669 A | 10/1987 | Head et al. |
| 4,705,406 A | 11/1987 | Havel |
| 4,707,141 A | 11/1987 | Havel |
| D293,723 S | 1/1988 | Buttner |
| 4,727,289 A | 2/1988 | Uchida |
| 4,727,457 A | 2/1988 | Thillays |
| 4,739,454 A | 4/1988 | Federgreen |
| 4,740,882 A | 4/1988 | Miller |
| 4,748,545 A | 5/1988 | Schmitt |
| 4,753,148 A | 6/1988 | Johnson |
| 4,758,173 A | 7/1988 | Northrop |
| 4,765,708 A | 8/1988 | Becker et al. |
| 4,767,172 A | 8/1988 | Nichols et al. |
| 4,771,274 A | 9/1988 | Havel |
| 4,780,621 A | 10/1988 | Bartleucci et al. |
| 4,794,373 A | 12/1988 | Harrison |
| 4,794,383 A | 12/1988 | Havel |
| 4,801,928 A | 1/1989 | Minter |
| 4,810,937 A | 3/1989 | Havel |
| 4,818,072 A | 4/1989 | Mohebban |
| 4,824,269 A | 4/1989 | Havel |
| 4,837,565 A | 6/1989 | White |
| 4,843,627 A | 6/1989 | Stebbins |
| 4,845,481 A | 7/1989 | Havel |
| 4,845,745 A | 7/1989 | Havel |
| 4,847,536 A | 7/1989 | Lowe et al. |
| 4,851,972 A | 7/1989 | Altman |
| 4,854,701 A | 8/1989 | Noll et al. |
| 4,857,801 A | 8/1989 | Farrell |
| 4,863,223 A | 9/1989 | Weissenbach et al. |
| 4,870,325 A | 9/1989 | Kazar |
| 4,874,320 A | 10/1989 | Freed et al. |
| 4,887,074 A | 12/1989 | Simon et al. |
| 4,894,832 A | 1/1990 | Colak |
| 4,901,207 A | 2/1990 | Sato et al. |
| 4,904,988 A | 2/1990 | Nesbit et al. |
| 4,912,371 A | 3/1990 | Hamilton |
| 4,920,459 A | 4/1990 | Rothwell et al. |
| 4,922,154 A | 5/1990 | Cacoub |
| 4,929,936 A | 5/1990 | Friedman et al. |
| 4,934,852 A | 6/1990 | Havel |
| 4,941,072 A | 7/1990 | Yasumoto et al. |
| 4,943,900 A | 7/1990 | Gartner |
| 4,962,687 A | 10/1990 | Belliveau et al. |
| 4,965,561 A | 10/1990 | Havel |
| 4,973,835 A | 11/1990 | Kurosu et al. |
| 4,977,351 A | 12/1990 | Bavaro et al. |
| 4,979,081 A | 12/1990 | Leach et al. |
| 4,979,180 A | 12/1990 | Muncheryan |
| 4,980,806 A | 12/1990 | Taylor et al. |
| 4,991,070 A | 2/1991 | Stob |
| 4,992,704 A | 2/1991 | Stinson |

(56) References Cited

U.S. PATENT DOCUMENTS

| | | |
|---|---|---|
| 5,001,609 A | 3/1991 | Gardner et al. |
| 5,003,227 A | 3/1991 | Nilssen |
| 5,008,595 A | 4/1991 | Kazar |
| 5,008,788 A | 4/1991 | Palinkas |
| 5,010,459 A | 4/1991 | Taylor et al. |
| 5,018,054 A | 5/1991 | Ohashi et al. |
| 5,027,037 A | 6/1991 | Wei |
| 5,027,262 A | 6/1991 | Freed |
| 5,032,960 A | 7/1991 | Katoh |
| 5,034,807 A | 7/1991 | Von Kohorn |
| 5,036,248 A | 7/1991 | McEwan et al. |
| 5,038,255 A | 8/1991 | Nishihashi et al. |
| 5,065,226 A | 11/1991 | Kluitmans et al. |
| 5,072,216 A | 12/1991 | Grange |
| 5,078,039 A | 1/1992 | Tulk et al. |
| 5,083,063 A | 1/1992 | Brooks |
| 5,088,013 A | 2/1992 | Revis |
| 5,089,748 A | 2/1992 | Ihms |
| 5,103,382 A | 4/1992 | Kondo et al. |
| 5,122,733 A | 6/1992 | Havel |
| 5,126,634 A | 6/1992 | Johnson |
| 5,128,595 A | 7/1992 | Hara |
| 5,130,761 A | 7/1992 | Tanaka |
| 5,130,909 A | 7/1992 | Gross |
| 5,134,387 A | 7/1992 | Smith et al. |
| 5,136,483 A | 8/1992 | Schoniger et al. |
| 5,140,220 A | 8/1992 | Hasegawa |
| 5,142,199 A | 8/1992 | Elwell |
| 5,151,679 A | 9/1992 | Dimmick |
| 5,154,641 A | 10/1992 | McLaughlin |
| 5,161,879 A | 11/1992 | McDermott |
| 5,161,882 A | 11/1992 | Garrett |
| 5,164,715 A | 11/1992 | Kashiwabara et al. |
| 5,184,114 A | 2/1993 | Brown |
| 5,194,854 A | 3/1993 | Havel |
| 5,198,756 A | 3/1993 | Jenkins et al. |
| 5,209,560 A | 5/1993 | Taylor et al. |
| 5,220,250 A | 6/1993 | Szuba |
| 5,225,765 A | 7/1993 | Callahan et al. |
| 5,226,723 A | 7/1993 | Chen |
| 5,254,910 A | 10/1993 | Yang |
| 5,256,948 A | 10/1993 | Boldin et al. |
| 5,268,828 A | 12/1993 | Miura |
| 5,278,542 A | 1/1994 | Smith et al. |
| 5,282,121 A | 1/1994 | Bornhorst et al. |
| 5,283,517 A | 2/1994 | Havel |
| 5,287,352 A | 2/1994 | Jackson et al. |
| 5,294,865 A | 3/1994 | Haraden |
| 5,298,871 A | 3/1994 | Shimohara |
| 5,301,090 A | 4/1994 | Hed |
| 5,303,124 A | 4/1994 | Wrobel |
| 5,307,295 A | 4/1994 | Taylor et al. |
| 5,321,593 A | 6/1994 | Moates |
| 5,323,226 A | 6/1994 | Schreder |
| 5,329,431 A | 7/1994 | Taylor et al. |
| 5,344,068 A | 9/1994 | Haessig |
| 5,350,977 A | 9/1994 | Hamamoto et al. |
| 5,357,170 A | 10/1994 | Luchaco et al. |
| 5,365,411 A | 11/1994 | Rycroft et al. |
| 5,371,618 A | 12/1994 | Tai et al. |
| 5,374,876 A | 12/1994 | Horibata et al. |
| 5,375,043 A | 12/1994 | Tokunaga |
| D354,360 S | 1/1995 | Murata |
| 5,381,074 A | 1/1995 | Rudzewicz et al. |
| 5,388,357 A | 2/1995 | Malita |
| 5,402,702 A | 4/1995 | Hata |
| 5,404,094 A | 4/1995 | Green et al. |
| 5,404,282 A | 4/1995 | Klinke et al. |
| 5,406,176 A | 4/1995 | Sugden |
| 5,410,328 A | 4/1995 | Yoksza et al. |
| 5,412,284 A | 5/1995 | Moore et al. |
| 5,412,552 A | 5/1995 | Fernandes |
| 5,420,482 A | 5/1995 | Phares |
| 5,421,059 A | 6/1995 | Leffers, Jr. |
| 5,430,356 A | 7/1995 | Ference et al. |
| 5,432,408 A | 7/1995 | Matsuda et al. |
| 5,436,535 A | 7/1995 | Yang |
| 5,436,853 A | 7/1995 | Shimohara |
| 5,450,301 A | 9/1995 | Waltz et al. |
| 5,461,188 A | 10/1995 | Drago et al. |
| 5,463,280 A | 10/1995 | Johnson |
| 5,463,502 A | 10/1995 | Savage, Jr. |
| 5,465,144 A | 11/1995 | Parker et al. |
| 5,473,522 A | 12/1995 | Kriz et al. |
| 5,475,300 A | 12/1995 | Havel |
| 5,481,441 A | 1/1996 | Stevens |
| 5,489,827 A | 2/1996 | Xia |
| 5,491,402 A | 2/1996 | Small |
| 5,493,183 A | 2/1996 | Kimball |
| 5,504,395 A | 4/1996 | Johnson et al. |
| 5,506,760 A | 4/1996 | Giebler et al. |
| 5,513,082 A | 4/1996 | Asano |
| 5,519,496 A | 5/1996 | Borgert et al. |
| 5,530,322 A | 6/1996 | Ference et al. |
| 5,539,628 A | 7/1996 | Seib |
| 5,544,809 A | 8/1996 | Keating et al. |
| 5,545,950 A | 8/1996 | Cho |
| 5,550,440 A | 8/1996 | Allison et al. |
| 5,559,681 A | 9/1996 | Duarte |
| 5,561,346 A | 10/1996 | Byrne |
| D376,030 S | 11/1996 | Cohen |
| 5,575,459 A | 11/1996 | Anderson |
| 5,575,554 A | 11/1996 | Guritz |
| 5,581,158 A | 12/1996 | Quazi |
| 5,592,051 A | 1/1997 | Korkala |
| 5,592,054 A | 1/1997 | Nerone et al. |
| 5,600,199 A | 2/1997 | Martin, Sr. et al. |
| 5,607,227 A | 3/1997 | Yasumoto et al. |
| 5,608,290 A | 3/1997 | Hutchisson et al. |
| 5,614,788 A | 3/1997 | Mullins et al. |
| 5,621,282 A | 4/1997 | Haskell |
| 5,621,603 A | 4/1997 | Adamec et al. |
| 5,621,662 A | 4/1997 | Humphries et al. |
| 5,622,423 A | 4/1997 | Lee |
| 5,633,629 A | 5/1997 | Hochstein |
| 5,634,711 A | 6/1997 | Kennedy et al. |
| 5,639,158 A | 6/1997 | Sato |
| 5,640,061 A | 6/1997 | Bornhorst et al. |
| 5,640,141 A | 6/1997 | Myllymaki |
| 5,640,792 A | 6/1997 | O'Shea et al. |
| 5,642,129 A | 6/1997 | Zavracky et al. |
| 5,655,830 A * | 8/1997 | Ruskouski ............... F21K 9/135 257/E25.028 |
| 5,656,935 A | 8/1997 | Havel |
| 5,661,374 A | 8/1997 | Cassidy et al. |
| 5,661,645 A | 8/1997 | Hochstein |
| 5,673,059 A | 9/1997 | Zavracky et al. |
| 5,682,103 A | 10/1997 | Burrell |
| 5,684,523 A | 11/1997 | Satoh et al. |
| 5,688,042 A | 11/1997 | Madadi et al. |
| 5,690,417 A | 11/1997 | Choate et al. |
| 5,697,695 A | 12/1997 | Lin et al. |
| 5,701,058 A | 12/1997 | Roth |
| 5,712,650 A | 1/1998 | Barlow |
| 5,713,655 A | 2/1998 | Blackman |
| 5,721,471 A | 2/1998 | Begemann et al. |
| 5,725,148 A | 3/1998 | Hartman |
| 5,726,535 A | 3/1998 | Yan |
| 5,731,759 A | 3/1998 | Finucan |
| 5,734,590 A | 3/1998 | Tebbe |
| 5,751,118 A | 5/1998 | Mortimer |
| 5,752,766 A | 5/1998 | Bailey et al. |
| 5,765,940 A | 6/1998 | Levy et al. |
| 5,769,527 A | 6/1998 | Taylor et al. |
| 5,784,006 A | 7/1998 | Hochstein |
| 5,785,227 A | 7/1998 | Akiba |
| 5,790,329 A | 8/1998 | Klaus et al. |
| 5,803,579 A | 9/1998 | Turnbull et al. |
| 5,803,580 A | 9/1998 | Tseng |
| 5,803,729 A | 9/1998 | Tsimerman |
| 5,806,965 A | 9/1998 | Deese |
| 5,808,689 A | 9/1998 | Small |
| 5,810,463 A | 9/1998 | Kawahara et al. |
| 5,812,105 A | 9/1998 | Van de Ven |

(56) References Cited

U.S. PATENT DOCUMENTS

| | | |
|---|---|---|
| 5,813,751 A | 9/1998 | Shaffer |
| 5,813,753 A | 9/1998 | Vriens et al. |
| 5,821,695 A | 10/1998 | Vilanilam et al. |
| 5,825,051 A | 10/1998 | Bauer et al. |
| 5,828,178 A | 10/1998 | York et al. |
| 5,831,522 A | 11/1998 | Weed et al. |
| 5,836,676 A | 11/1998 | Ando et al. |
| 5,848,837 A | 12/1998 | Gustafson |
| 5,850,126 A | 12/1998 | Kanbar |
| 5,851,063 A | 12/1998 | Doughty et al. |
| 5,852,658 A | 12/1998 | Knight et al. |
| 5,854,542 A | 12/1998 | Forbes |
| RE36,030 E | 1/1999 | Nadeau |
| 5,859,508 A | 1/1999 | Ge et al. |
| 5,865,529 A | 2/1999 | Yan |
| 5,870,233 A | 2/1999 | Benz et al. |
| 5,890,794 A | 4/1999 | Abtahi et al. |
| 5,893,633 A | 4/1999 | Saito et al. |
| 5,896,010 A | 4/1999 | Mikolajczak et al. |
| 5,904,415 A | 5/1999 | Robertson et al. |
| 5,907,742 A | 5/1999 | Johnson et al. |
| 5,909,378 A | 6/1999 | De Milleville |
| 5,912,653 A | 6/1999 | Fitch |
| 5,917,287 A | 6/1999 | Haederle et al. |
| 5,917,534 A | 6/1999 | Rajeswaran |
| 5,921,660 A | 7/1999 | Yu |
| 5,924,784 A | 7/1999 | Chliwnyj et al. |
| 5,927,845 A | 7/1999 | Gustafson et al. |
| 5,934,792 A | 8/1999 | Camarota |
| 5,936,599 A | 8/1999 | Reymond |
| 5,943,802 A | 8/1999 | Tijanic |
| 5,946,209 A | 8/1999 | Eckel et al. |
| 5,949,347 A * | 9/1999 | Wu .................... 340/815.45 |
| 5,951,145 A | 9/1999 | Iwasaki et al. |
| 5,952,680 A | 9/1999 | Strite |
| 5,959,547 A | 9/1999 | Tubel et al. |
| 5,961,072 A | 10/1999 | Bodle |
| 5,962,989 A | 10/1999 | Baker |
| 5,962,992 A | 10/1999 | Huang et al. |
| 5,963,185 A | 10/1999 | Havel |
| 5,966,069 A | 10/1999 | Zmurk et al. |
| 5,974,553 A | 10/1999 | Gandar |
| 5,980,064 A | 11/1999 | Metroyanis |
| 5,998,925 A | 12/1999 | Shimizu et al. |
| 5,998,928 A | 12/1999 | Hipp |
| 6,000,807 A | 12/1999 | Moreland |
| 6,007,209 A | 12/1999 | Pelka |
| 6,008,783 A | 12/1999 | Kitagawa et al. |
| 6,010,228 A | 1/2000 | Blackman et al. |
| 6,011,691 A | 1/2000 | Schreffler |
| 6,016,038 A | 1/2000 | Mueller et al. |
| 6,018,237 A | 1/2000 | Havel |
| 6,019,493 A | 2/2000 | Kuo et al. |
| 6,020,825 A | 2/2000 | Chansky et al. |
| 6,025,550 A | 2/2000 | Kato |
| 6,028,694 A | 2/2000 | Schmidt |
| 6,030,099 A | 2/2000 | McDermott |
| 6,031,343 A | 2/2000 | Recknagel et al. |
| 6,031,958 A | 2/2000 | McGaffigan |
| 6,036,335 A | 3/2000 | Openiano |
| 6,036,336 A | 3/2000 | Wu |
| D422,737 S | 4/2000 | Orozco |
| 6,056,420 A | 5/2000 | Wilson et al. |
| 6,068,383 A | 5/2000 | Robertson et al. |
| 6,069,597 A | 5/2000 | Hansen |
| 6,072,280 A | 6/2000 | Allen |
| 6,084,359 A | 7/2000 | Hetzel et al. |
| 6,086,220 A | 7/2000 | Lash et al. |
| 6,091,200 A | 7/2000 | Lenz |
| 6,092,915 A | 7/2000 | Rensch |
| 6,095,661 A | 8/2000 | Lebens et al. |
| 6,097,352 A | 8/2000 | Zavracky et al. |
| 6,115,184 A | 9/2000 | Hubble, III et al. |
| 6,116,748 A | 9/2000 | George |
| 6,121,875 A | 9/2000 | Hamm et al. |
| 6,127,783 A | 10/2000 | Pashley et al. |
| 6,132,072 A | 10/2000 | Turnbull et al. |
| 6,135,604 A | 10/2000 | Lin |
| 6,135,620 A | 10/2000 | Marsh |
| 6,139,174 A | 10/2000 | Butterworth |
| 6,149,283 A | 11/2000 | Conway et al. |
| 6,150,774 A | 11/2000 | Mueller et al. |
| 6,151,529 A | 11/2000 | Batko |
| 6,153,985 A | 11/2000 | Grossman |
| 6,158,882 A | 12/2000 | Bischoff, Jr. |
| 6,166,496 A | 12/2000 | Lys et al. |
| 6,175,201 B1 | 1/2001 | Sid |
| 6,175,220 B1 | 1/2001 | Billig et al. |
| 6,181,126 B1 | 1/2001 | Havel |
| D437,947 S | 2/2001 | Huang |
| 6,183,086 B1 | 2/2001 | Neubert |
| 6,183,104 B1 | 2/2001 | Ferrara |
| 6,184,628 B1 | 2/2001 | Ruthenberg |
| 6,196,471 B1 | 3/2001 | Ruthenberg |
| 6,203,180 B1 | 3/2001 | Fleischmann |
| 6,211,626 B1 | 4/2001 | Lys et al. |
| 6,215,409 B1 | 4/2001 | Blach |
| 6,217,190 B1 | 4/2001 | Altman et al. |
| 6,219,239 B1 | 4/2001 | Mellberg et al. |
| 6,227,679 B1 | 5/2001 | Zhang et al. |
| 6,234,645 B1 | 5/2001 | Börner et al. |
| 6,238,075 B1 | 5/2001 | Dealey, Jr. et al. |
| 6,240,665 B1 | 6/2001 | Brown et al. |
| 6,241,359 B1 | 6/2001 | Lin |
| 6,249,221 B1 | 6/2001 | Reed |
| 6,250,774 B1 | 6/2001 | Begemann et al. |
| 6,252,350 B1 | 6/2001 | Alvarez |
| 6,252,358 B1 | 6/2001 | Xydis et al. |
| 6,268,600 B1 | 7/2001 | Nakamura et al. |
| 6,273,338 B1 | 8/2001 | White |
| 6,292,901 B1 | 9/2001 | Lys et al. |
| 6,297,724 B1 | 10/2001 | Bryans et al. |
| 6,305,109 B1 | 10/2001 | Lee |
| 6,305,821 B1 | 10/2001 | Hsieh et al. |
| 6,307,331 B1 | 10/2001 | Bonasia et al. |
| 6,310,590 B1 | 10/2001 | Havel |
| 6,315,429 B1 | 11/2001 | Grandolfo |
| 6,323,832 B1 | 11/2001 | Nishizawa et al. |
| 6,325,651 B1 | 12/2001 | Nishihara et al. |
| 6,334,699 B1 | 1/2002 | Gladnick |
| 6,340,868 B1 | 1/2002 | Lys et al. |
| 6,362,578 B1 | 3/2002 | Swanson et al. |
| 6,371,637 B1 | 4/2002 | Atchinson et al. |
| 6,380,865 B1 | 4/2002 | Pederson |
| 6,394,623 B1 | 5/2002 | Tsui |
| 6,400,096 B1 | 6/2002 | Wells et al. |
| 6,404,131 B1 | 6/2002 | Kawano et al. |
| 6,411,045 B1 | 6/2002 | Nerone |
| 6,429,604 B1 | 8/2002 | Chang |
| 6,445,139 B1 | 9/2002 | Marshall et al. |
| 6,459,919 B1 | 10/2002 | Lys et al. |
| 6,464,373 B1 | 10/2002 | Petrick |
| 6,469,457 B2 | 10/2002 | Callahan |
| 6,471,388 B1 | 10/2002 | Marsh |
| 6,495,964 B1 | 12/2002 | Muthu et al. |
| 6,511,204 B2 | 1/2003 | Emmel et al. |
| 6,528,954 B1 | 3/2003 | Lys et al. |
| 6,540,381 B1 | 4/2003 | Douglass, II |
| 6,541,800 B2 | 4/2003 | Barnett et al. |
| 6,548,967 B1 | 4/2003 | Dowling et al. |
| 6,568,834 B1 | 5/2003 | Scianna |
| 6,577,072 B2 | 6/2003 | Saito et al. |
| 6,577,080 B2 | 6/2003 | Lys et al. |
| 6,577,794 B1 | 6/2003 | Currie et al. |
| 6,582,103 B1 | 6/2003 | Popovich et al. |
| 6,585,393 B1 | 7/2003 | Brandes et al. |
| 6,608,453 B2 | 8/2003 | Morgan et al. |
| 6,609,813 B1 | 8/2003 | Showers et al. |
| 6,612,729 B1 | 9/2003 | Hoffman |
| 6,621,222 B1 | 9/2003 | Hong |
| 6,624,597 B2 | 9/2003 | Dowling et al. |
| 6,682,205 B2 | 1/2004 | Lin |
| 6,712,486 B1 | 3/2004 | Popovich et al. |
| 6,717,376 B2 | 4/2004 | Lys et al. |

(56) References Cited

U.S. PATENT DOCUMENTS

| | | | |
|---|---|---|---|
| 6,720,745 | B2 | 4/2004 | Lys et al. |
| 6,736,525 | B2 | 5/2004 | Chin |
| 6,762,562 | B2 | 7/2004 | Leong |
| 6,768,047 | B2 | 7/2004 | Chang et al. |
| 6,774,584 | B2 | 8/2004 | Lys et al. |
| 6,777,891 | B2 | 8/2004 | Lys et al. |
| 6,781,329 | B2 | 8/2004 | Mueller et al. |
| 6,788,011 | B2 | 9/2004 | Mueller et al. |
| 6,796,680 | B1 | 9/2004 | Showers et al. |
| 6,806,659 | B1 | 10/2004 | Mueller et al. |
| 6,853,151 | B2 | 2/2005 | Leong et al. |
| 6,869,204 | B2 | 3/2005 | Morgan et al. |
| 6,888,322 | B2 | 5/2005 | Dowling et al. |
| 6,897,624 | B2 | 5/2005 | Lys et al. |
| 6,936,978 | B2 | 8/2005 | Morgan et al. |
| 6,953,261 | B1 | 10/2005 | Jiao et al. |
| 6,965,205 | B2 | 11/2005 | Piepgras et al. |
| 6,967,448 | B2 | 11/2005 | Morgan et al. |
| 6,975,079 | B2 | 12/2005 | Lys et al. |
| 7,014,336 | B1 | 3/2006 | Ducharme et al. |
| 7,031,920 | B2 | 4/2006 | Dowling et al. |
| 7,038,398 | B1 | 5/2006 | Lys et al. |
| 7,049,761 | B2 | 5/2006 | Timmermans et al. |
| 7,064,498 | B2 | 6/2006 | Dowling et al. |
| 7,102,902 | B1 | 9/2006 | Brown et al. |
| 7,113,541 | B1 | 9/2006 | Lys et al. |
| 7,120,560 | B2 | 10/2006 | Williams et al. |
| 7,132,785 | B2 | 11/2006 | Ducharme |
| 7,132,804 | B2 | 11/2006 | Lys et al. |
| 7,135,824 | B2 | 11/2006 | Lys et al. |
| 7,139,617 | B1 | 11/2006 | Morgan et al. |
| 7,161,311 | B2 | 1/2007 | Mueller et al. |
| 7,161,313 | B2 | 1/2007 | Piepgras et al. |
| 7,180,252 | B2 | 2/2007 | Lys et al. |
| 7,186,003 | B2 | 3/2007 | Dowling et al. |
| 7,187,141 | B2 | 3/2007 | Mueller et al. |
| 7,221,104 | B2 | 5/2007 | Lys et al. |
| 7,231,060 | B2 | 6/2007 | Dowling et al. |
| 7,233,831 | B2 | 6/2007 | Blackwell |
| 7,242,152 | B2 | 7/2007 | Dowling et al. |
| 7,248,239 | B2 | 7/2007 | Dowling et al. |
| 7,253,566 | B2 | 8/2007 | Lys et al. |
| 7,255,457 | B2 | 8/2007 | Ducharme et al. |
| 7,274,160 | B2 | 9/2007 | Mueller et al. |
| 7,308,296 | B2 | 12/2007 | Lys et al. |
| 7,309,965 | B2 | 12/2007 | Dowling et al. |
| 7,344,278 | B2 | 3/2008 | Paravantsos |
| 7,350,936 | B2 | 4/2008 | Ducharme et al. |
| 7,353,071 | B2 | 4/2008 | Blackwell et al. |
| 7,385,359 | B2 | 6/2008 | Dowling et al. |
| 7,401,935 | B2 | 7/2008 | VanderSchuit |
| 7,427,840 | B2 | 9/2008 | Morgan et al. |
| 7,510,299 | B2 | 3/2009 | Timmermans et al. |
| 7,598,686 | B2 | 10/2009 | Lys et al. |
| 7,600,907 | B2 | 10/2009 | Liu et al. |
| RE42,161 | E | 2/2011 | Hochstein |
| 8,093,823 | B1 | 1/2012 | Ivey et al. |
| 8,247,985 | B2 | 8/2012 | Timmermans et al. |
| 8,382,327 | B2 | 2/2013 | Timmermans et al. |
| 8,482,212 | B1 | 7/2013 | Ivey et al. |
| 8,870,412 | B1 * | 10/2014 | Timmermans ............ F21K 9/17 362/249.01 |
| 2001/0033488 | A1 | 10/2001 | Chliwnyj et al. |
| 2002/0011801 | A1 | 1/2002 | Chang |
| 2002/0047569 | A1 | 4/2002 | Dowling et al. |
| 2002/0047628 | A1 | 4/2002 | Morgan et al. |
| 2002/0048169 | A1 | 4/2002 | Dowling et al. |
| 2002/0048174 | A1 | 4/2002 | Pederson |
| 2002/0057061 | A1 | 5/2002 | Mueller et al. |
| 2002/0070688 | A1 | 6/2002 | Dowling et al. |
| 2002/0074559 | A1 | 6/2002 | Dowling et al. |
| 2002/0074958 | A1 | 6/2002 | Crenshaw |
| 2002/0078221 | A1 | 6/2002 | Blackwell et al. |
| 2002/0101197 | A1 | 8/2002 | Lys et al. |
| 2002/0113555 | A1 | 8/2002 | Lys et al. |
| 2002/0130627 | A1 | 9/2002 | Morgan et al. |
| 2002/0152045 | A1 | 10/2002 | Dowling et al. |
| 2002/0153851 | A1 | 10/2002 | Morgan et al. |
| 2002/0158583 | A1 | 10/2002 | Lys et al. |
| 2002/0163316 | A1 | 11/2002 | Lys et al. |
| 2002/0171365 | A1 | 11/2002 | Morgan et al. |
| 2002/0171377 | A1 | 11/2002 | Mueller et al. |
| 2002/0171378 | A1 | 11/2002 | Morgan et al. |
| 2002/0176259 | A1 | 11/2002 | Ducharme |
| 2003/0011538 | A1 | 1/2003 | Lys et al. |
| 2003/0057884 | A1 | 3/2003 | Dowling et al. |
| 2003/0057886 | A1 | 3/2003 | Lys et al. |
| 2003/0057887 | A1 | 3/2003 | Dowling et al. |
| 2003/0057890 | A1 | 3/2003 | Lys et al. |
| 2003/0076281 | A1 | 4/2003 | Morgan et al. |
| 2003/0100837 | A1 | 5/2003 | Lys et al. |
| 2003/0133292 | A1 | 7/2003 | Mueller et al. |
| 2003/0137258 | A1 | 7/2003 | Piepgras et al. |
| 2003/0222587 | A1 | 12/2003 | Dowling, Jr. et al. |
| 2004/0052076 | A1 | 3/2004 | Mueller et al. |
| 2004/0085219 | A1 | 5/2004 | Pederson |
| 2004/0090191 | A1 | 5/2004 | Mueller et al. |
| 2004/0105261 | A1 | 6/2004 | Ducharme et al. |
| 2004/0145490 | A1 | 7/2004 | Pederson |
| 2004/0155609 | A1 | 8/2004 | Lys et al. |
| 2004/0178751 | A1 | 9/2004 | Mueller et al. |
| 2004/0212320 | A1 | 10/2004 | Dowling et al. |
| 2004/0212993 | A1 | 10/2004 | Morgan et al. |
| 2004/0240890 | A1 | 12/2004 | Lys et al. |
| 2004/0257007 | A1 | 12/2004 | Lys et al. |
| 2005/0030744 | A1 | 2/2005 | Ducharme et al. |
| 2005/0041161 | A1 | 2/2005 | Dowling et al. |
| 2005/0041424 | A1 | 2/2005 | Ducharme |
| 2005/0043907 | A1 | 2/2005 | Eckel et al. |
| 2005/0044617 | A1 | 3/2005 | Mueller et al. |
| 2005/0047132 | A1 | 3/2005 | Dowling et al. |
| 2005/0047134 | A1 | 3/2005 | Mueller et al. |
| 2005/0062440 | A1 | 3/2005 | Lys et al. |
| 2005/0063194 | A1 | 3/2005 | Lys et al. |
| 2005/0099317 | A1 | 5/2005 | Pederson |
| 2005/0151489 | A1 | 7/2005 | Lys et al. |
| 2005/0166634 | A1 | 8/2005 | Lieberman et al. |
| 2005/0174473 | A1 | 8/2005 | Morgan et al. |
| 2005/0184667 | A1 | 8/2005 | Sturman et al. |
| 2005/0236998 | A1 | 10/2005 | Mueller et al. |
| 2005/0285547 | A1 | 12/2005 | Piepgras et al. |
| 2006/0012987 | A9 | 1/2006 | Ducharme et al. |
| 2006/0016960 | A1 | 1/2006 | Morgan et al. |
| 2006/0050509 | A9 | 3/2006 | Dowling et al. |
| 2006/0109649 | A1 | 5/2006 | Ducharme et al. |
| 2006/0152172 | A9 | 7/2006 | Mueller et al. |
| 2006/0285325 | A1 | 12/2006 | Ducharme et al. |
| 2007/0030683 | A1 | 2/2007 | Popovich et al. |
| 2007/0047227 | A1 | 3/2007 | Ducharme |
| 2007/0086754 | A1 | 4/2007 | Lys et al. |
| 2007/0086912 | A1 | 4/2007 | Dowling et al. |
| 2007/0115658 | A1 | 5/2007 | Mueller et al. |
| 2007/0115665 | A1 | 5/2007 | Mueller et al. |
| 2007/0188427 | A1 | 8/2007 | Lys et al. |
| 2007/0195526 | A1 | 8/2007 | Dowling et al. |
| 2007/0258240 | A1 | 11/2007 | Ducharme et al. |
| 2008/0012506 | A1 | 1/2008 | Mueller et al. |
| 2011/0109454 | A1 | 5/2011 | McSheffrey, Sr. et al. |
| 2013/0200797 | A1 | 8/2013 | Timmermans et al. |

FOREIGN PATENT DOCUMENTS

| | | |
|---|---|---|
| DE | 196 24 087 A1 | 12/1997 |
| DE | 299 00 320 U1 | 5/1999 |
| DE | 298 17 609 U1 | 1/2000 |
| EP | 0 091 172 A2 | 10/1983 |
| EP | 0 124 924 B1 | 9/1987 |
| EP | 0 174 699 B1 | 11/1988 |
| EP | 0 197 602 B1 | 11/1990 |
| EP | 0 390 262 B1 | 12/1993 |
| EP | 0 359 329 B1 | 3/1994 |
| EP | 0 403 011 B1 | 4/1994 |
| EP | 0 632 511 A2 | 1/1995 |
| EP | 0 432 848 B1 | 4/1995 |

(56) References Cited

FOREIGN PATENT DOCUMENTS

| | | | |
|---|---|---|---|
| EP | 0 525 876 | B1 | 5/1996 |
| EP | 0 714 556 | B1 | 1/1999 |
| EP | 0 889 283 | A1 | 7/1999 |
| EP | 0 458 408 | B1 | 9/1999 |
| EP | 0 578 302 | B1 | 9/1999 |
| GB | 2165977 | A | 4/1986 |
| GB | 2 215 024 | A | 9/1989 |
| GB | 2 324 901 | A | 11/1998 |
| JP | S62-241382 | A | 10/1987 |
| JP | S62-248271 | A | 10/1987 |
| JP | H05-102530 | A | 4/1993 |
| JP | H6-54103 | | 7/1994 |
| JP | 07-249467 | A | 9/1995 |
| JP | 07-264036 | A | 10/1995 |
| JP | 08-162677 | A | 6/1996 |
| JP | H8-162677 | | 6/1996 |
| JP | 162677 | * | 8/1996 |
| JP | 10-308536 | A | 11/1998 |
| JP | H11-135274 | | 5/1999 |
| JP | 11-162234 | A | 6/1999 |
| JP | H11-162234 | A | 6/1999 |
| JP | H11-260125 | A | 9/1999 |
| JP | 5102530 | B2 | 12/2012 |
| WO | 99/06759 | A1 | 2/1999 |
| WO | 99/10867 | A1 | 3/1999 |
| WO | 99/31560 | A2 | 6/1999 |
| WO | 99/45312 | A1 | 9/1999 |
| WO | 99/57945 | A1 | 11/1999 |
| WO | 00/01067 | A2 | 1/2000 |

OTHER PUBLICATIONS

Decision in *Altair Enginerring, Inc.* v. *LEDdynamics* (Fed. Cir. Mar. 9, 2011).
Web page at http://trucklite.com/leds__14.htm printed on Jan. 13, 2000.
Web page at http://trucklite.com/leds__2.htm printed on Jan. 13, 2000.
Web page at http://trucklite.com/leds__4.htm printed on Jan. 13, 2000.
Web page at http://www.telecite.com/en/products/options__en.htm printed on Jan. 13, 2000.
Web page at http://www.dialight.com/trans.htm printed on Jan. 13, 2000.
Web page at http://www.ledlight.com/replac.htm printed on Jan. 13, 2000.
LEDTRONICS, apparently 1996 Catalog, apparently cover page and p. 10.
Petition for Inter Partes Review of U.S. Pat. No. 8,093,823, IPR # 2014-00448 filed Feb. 19, 2014 in 1175 pages. (uploaded in three parts due to EFS size limits).
Petition for Inter Partes Review of U.S. Pat. No. 7,510,299, IPR # 2014-00710 filed Apr. 30, 2014 in 2135 pages. (uploaded in ten parts due to EFS size limits).
Claim charts submitted in initial invalidity contentions served on May 8, 2014 in Civil Case No. 2:13-cv-14961 (E.D. Mich.) in 174 pages.
Lighting Handbook, 8th Edition, Illuminating Engineering Society of North America, 1993, pp. 237-240.

* cited by examiner

LIGHT TUBE AND POWER SUPPLY CIRCUIT

CROSS-REFERENCE TO RELATED APPLICATIONS

This application is a continuation of U.S. patent application Ser. No. 14/299,909 and U.S. patent application Ser. No. 14/299,915, both filed Jun. 9, 2014, which are continuations of U.S. patent application Ser. No. 13/777,331, filed Feb. 26, 2013 and issued as U.S. Pat. No. 8,866,396 on Oct. 21, 2014, which is a continuation of U.S. patent application Ser. No. 12/965,019, filed Dec. 10, 2010 and issued as U.S. Pat. No. 8,382,327 on Feb. 26, 2013, which is a continuation of U.S. patent application Ser. No. 11/085,744, filed Mar. 21, 2005 and issued as U.S. Pat. No. 8,247,985 on Aug. 21, 2012, which is a continuation of U.S. patent application Ser. No. 09/782,375, filed Feb. 12, 2001 and issued as U.S. Pat. No. 7,049,761 on May 23, 2006, which claims the benefit of U.S. Provisional Application No. 60/181,744 filed Feb. 11, 2000.

FIELD OF THE INVENTION

The present invention relates to a light tube illuminated by LEDs (light emitting diodes) which are packaged inside the light tube and powered by a power supply circuit.

BACKGROUND OF THE INVENTION

Conventional fluorescent lighting systems include fluorescent light tubes and ballasts. Such lighting systems are used in a variety of locations, such as buildings and transit buses, for a variety of lighting purposes, such as area lighting or backlighting. Although conventional fluorescent lighting systems have some advantages over known lighting options, such as incandescent lighting systems, conventional fluorescent light tubes and ballasts have several shortcomings. Conventional fluorescent light tubes have a short life expectancy, are prone to fail when subjected to excessive vibration, consume high amounts of power, require a high operating voltage, and include several electrical connections which reduce reliability. Conventional ballasts are highly prone to fail when subjected to excessive vibration. Accordingly, there is a desire to provide a light tube and power supply circuit which overcome the shortcomings of conventional fluorescent lighting systems. That is, there is a desire to provide a light tube and power supply circuit which have a long life expectancy, are resistant to vibration failure, consume low amounts of power, operate on a low voltage, and are highly reliable. It would also be desirable for such a light tube to mount within a conventional fluorescent light tube socket.

SUMMARY OF THE INVENTION

Embodiments of a replacement light tube for replacing a fluorescent light tube are disclosed herein. In one embodiment, the replacement light tube includes an elongate tubular housing having a first end and a second end and a first end cap and a second end cap disposed on the first end and the second end, respectively, each configured to fit with a socket for the fluorescent light tube. The replacement light tube also includes a rigid support structure having a planar portion having a first surface extending within the elongate tubular housing between the first end and the second end and having spaced-apart sidewalls extending away from the first surface and extending within the elongate tubular housing between the first end and the second end. At least a portion of the sidewalls are in contact with an interior surface of the elongate tubular housing. Further, the replacement light tube includes a plurality of white light emitting diodes supported only by a second surface of the planar portion opposite to the first surface and between the first end and the second end. The plurality of light emitting diodes are arranged to emit light through the elongate tubular housing.

In another embodiment, the replacement light tube includes an elongate tubular housing having a first end and a second end and a first end cap and a second end cap disposed on the first end and the second end, respectively, each configured to fit with a socket for the fluorescent light tube and comprising a respective pair of electrical bi-pin connectors. The replacement light tube also includes a rigid support structure having a planar portion having a first surface extending within the elongate tubular housing between the first end and the second end and having spaced-apart sidewalls extending away from the first surface and extending within the elongate tubular housing between the first end and the second end. At least a portion of the sidewalls are in contact with an interior surface of the elongate tubular housing. Further, the replacement light tube includes a plurality of white light emitting diodes supported only by a second surface of the planar portion opposite to the first surface and between the first end and the second end. The plurality of light emitting diodes are arranged to emit light through the elongate tubular housing. The support structure divides the elongate tubular housing into a first space in which the plurality of light emitting diodes are housed and a second space defined by the planar portion, the sidewalls and the interior surface of the elongate tubular housing.

In another embodiment, the replacement light tube includes an elongate tubular housing having a first end and a second end, and a first end cap and a second end cap disposed on the first end and the second end, respectively, each configured to fit with a socket for the fluorescent light tube. The replacement light tube also includes a rigid support structure having a planar portion having a first surface extending within the elongate tubular housing between the first end and the second end and having spaced-apart sidewalls extending away from the first surface and extending within the elongate tubular housing between the first end and the second end. At least a portion of the sidewalls are in contact with an interior surface of the elongate tubular housing. Further, the replacement light tube includes a plurality of white light emitting diodes supported by the first surface between the first end and the second end. The plurality of light emitting diodes are arranged to emit light through the elongate tubular housing. The replacement light tube further includes a power supply circuit including a pulse width modulator and a current limiter. The power supply circuit is packaged within one of the end caps.

In another embodiment, the replacement light tube includes an elongate tubular housing having a first end and a second end and a first end cap and a second end cap disposed on the first end and the second end, respectively, each configured to fit with a socket for the fluorescent light tube. The replacement light tube also includes a rigid support structure having a planar portion having a first surface extending within the elongate tubular housing between the first end and the second end and having spaced-apart sidewalls extending away from the planar portion and extending within the elongate tubular housing between the first end and the second end. At least a portion of the sidewalls are in contact with an interior surface of the elongate tubular housing. The planar portion is integral with the sidewalls. Further, the replacement light tube includes a plurality of white light emitting diodes supported by the first surface between the first end and the second end. The plurality of light emitting diodes are arranged to emit light through the elongate tubular housing. The replacement light tube further includes a power supply circuit including a pulse width modulator and a current limiter. At least a portion of the power supply circuit is packaged within the elongate tubular housing or one of the end caps.

These and other embodiments will be discussed in additional detail hereafter.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
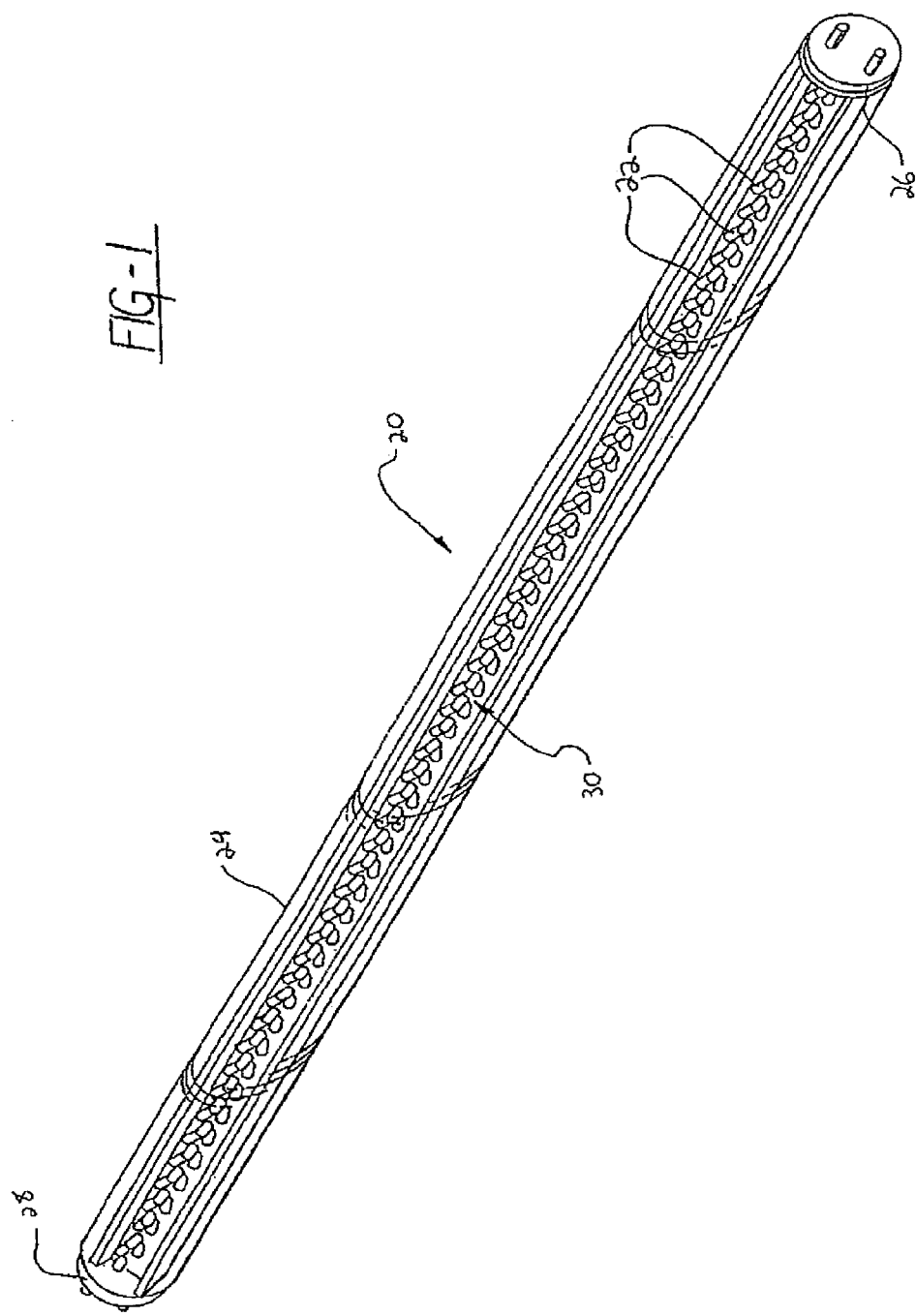
FIG. 1 is a line drawing showing a light tube, in perspective view, which in accordance with the present invention is illuminated by LEDs packaged inside the light tube.

FIG. 1 is a line drawing showing a light tube 20 in perspective view. In accordance with the present invention, the light tube 20 is illuminated by LEDs 22 packaged inside the light tube 20. The light tube 20 includes a cylindrically shaped bulb portion 24 having a pair of end caps 26 and 28 disposed at opposite ends of the bulb portion. Preferably, the bulb portion 24 is made from a transparent or translucent material such as glass, plastic, or the like. As such, the bulb material may be either clear or frosted.

In a preferred embodiment of the present invention, the light tube 20 has the same dimensions and end caps 26 and 28 (e.g. electrical male bi-pin connectors, type G13) as a conventional fluorescent light tube. As such, the present invention can be mounted in a conventional fluorescent light tube socket.

The line drawing of FIG. 1 also reveals the internal components of the light tube 20. The light tube 20 further includes a circuit board 30 with the LEDs 22 mounted thereon. The circuit board 30 and LEDs 22 are enclosed inside the bulb portion 24 and the end caps 26 and 28.

Figure 2:
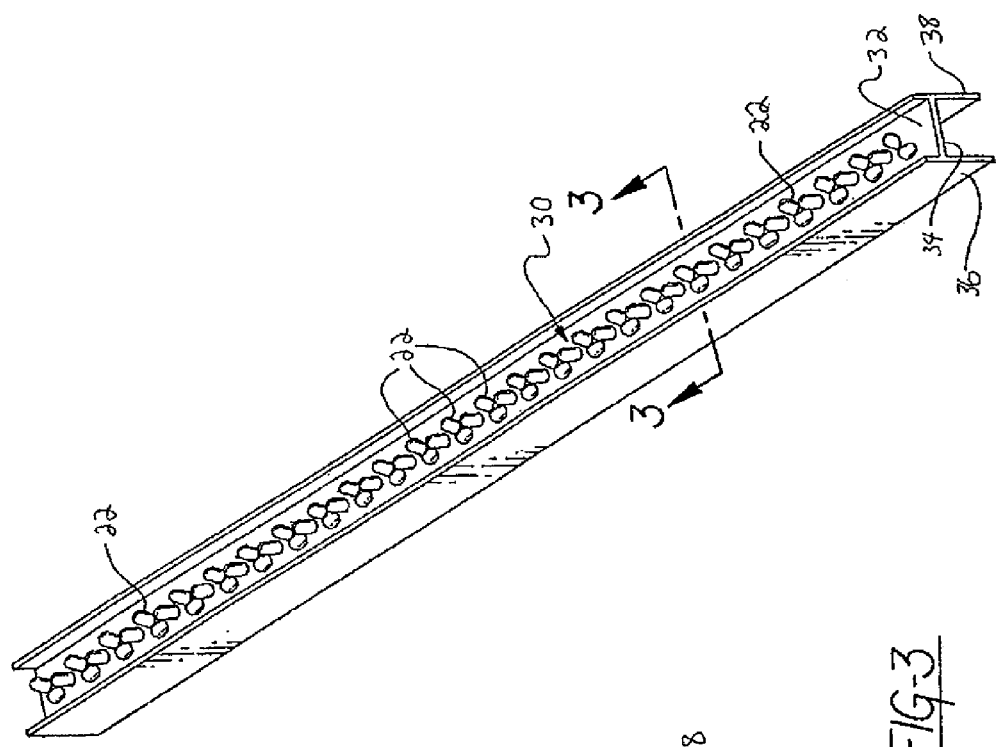
FIG. 2 is a perspective view of the LEDs mounted on a circuit board.

FIG. 2 is a perspective view of the LEDs 22 mounted on the circuit board 30. A group of LEDs 22, as shown in FIG. 2, is commonly referred to as a bank or array of LEDs. Within the scope of the present invention, the light tube 20 may include one or more banks or arrays of LEDs 22 mounted on one or more circuit boards 30. In a preferred embodiment of the present invention, the LEDs 22 emit white light and, thus, are commonly referred to in the art as white LEDs. In FIGS. 1 and 2, the LEDs 22 are mounted to one surface 32 of the circuit board 30. In a preferred embodiment of the present invention, the LEDs 22 are arranged to emit or shine white light through only one side of the bulb portion 24, thus directing the white light to a predetermined point of use. This arrangement reduces light losses due to imperfect reflection in a conventional lighting fixture. In alternative embodiments of the present invention, LEDs 22 may also be mounted, in any combination, to the other surfaces 34, 36, and/or 38 of the circuit board 30.

Figure 3:
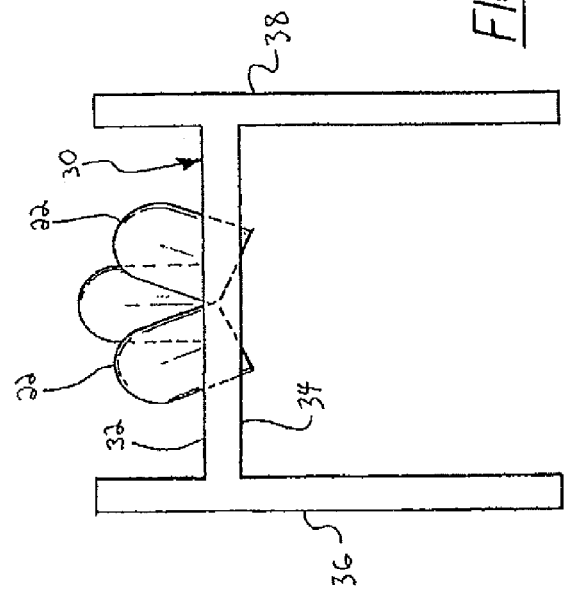
FIG. 3 is a cross-sectional view of FIG. 2 taken along lines 3-3.

FIG. 3 is a cross-sectional view of FIG. 2 taken along lines 3-3. To provide structural strength along the length of the light tube 20, the circuit board 30 is designed with a H-shaped cross-section. To produce a predetermined radiation pattern or dispersion of light from the light tube 20, each LED 22 is mounted at an angle relative to adjacent LEDs and/or the mounting surface 32. The total radiation pattern of light from the light tube 20 is effected by (1) the mounting angle of the LEDs 22 and (2) the radiation pattern of light from each LED. Currently, white LEDs having a viewing range between 6° and 45° are commercially available.

Figure 4:
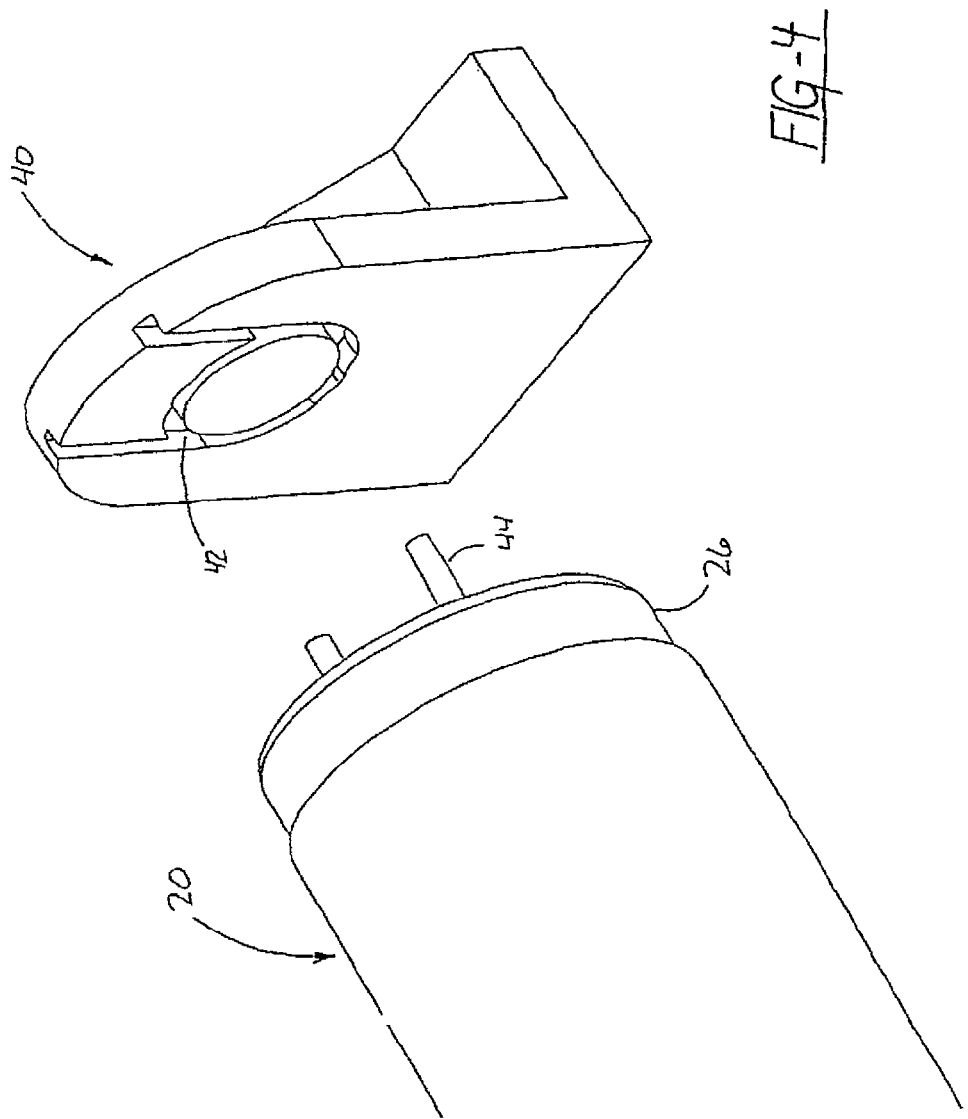
FIG. 4 is a fragmentary, perspective view of one embodiment of the present invention showing one end of the light tube disconnected from one end of a light tube socket.

FIG. 4 is a fragmentary, perspective view of one embodiment of the present invention showing one end of the light tube 20 disconnected from one end of a light tube socket 40. Similar to conventional fluorescent lighting systems and in this embodiment of the present invention, the light tube socket 40 includes a pair of electrical female connectors 42 and the light tube 20 includes a pair of mating electrical male connectors 44.

Within the scope of the present invention, the light tube 20 may be powered by one of four power supply circuits 100, 200, 300, and 400. A first power supply circuit includes a power source and a conventional fluorescent ballast. A second power supply circuit includes a power source and a rectifier/filter circuit. A third power supply circuit includes a DC power source and a PWM (Pulse Width Modulation) circuit. A fourth power supply circuit powers the light tube 20 inductively.

Figure 5:
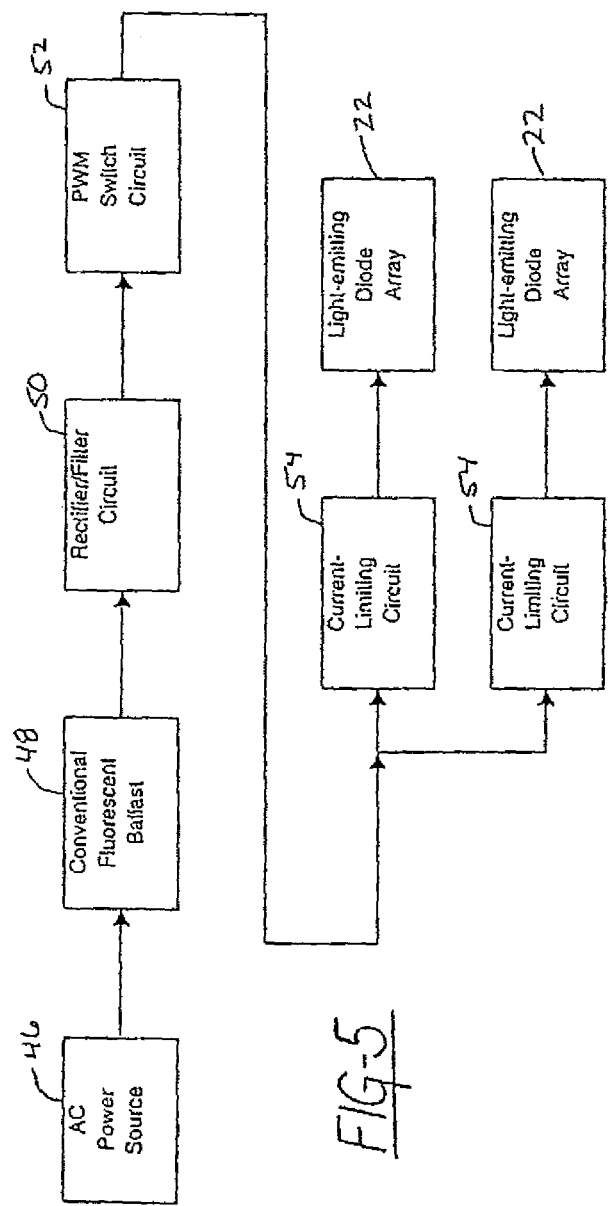
FIG. 5 is an electrical block diagram of a first power supply circuit for supplying power to the light tube.

FIG. 5 is an electrical block diagram of a first power supply circuit 100 for supplying power to the light tube 20. The first power supply circuit 100 is particularly adapted to operate within an existing, conventional fluorescent lighting system. As such, the first power supply circuit 100 includes a conventional fluorescent light tube socket 40 having two electrical female connectors 42 disposed at opposite ends of the socket. Accordingly, a light tube 20 particularly adapted for use with the first power supply circuit 100 includes two end caps 26 and 28, each end cap having the form of an electrical male connector 44 which mates with a corresponding electrical female connector 42 in the socket 40.

The first power supply circuit 100 also includes a power source 46 and a conventional magnetic or electronic fluorescent ballast 48. The power source 46 supplies power to the conventional fluorescent ballast 48.

The first power supply circuit 100 further includes a rectifier/filter circuit 50, a PWM circuit 52, and one or more current-limiting circuits 54. The rectifier/filter circuit 50, the PWM circuit 52, and the one or more current-limiting circuits 54 of the first power supply circuit 100 are packaged inside one of the two end caps 26 or 28 of the light tube 20.

The rectifier/filter circuit 50 receives AC power from the ballast 48 and converts the AC power to DC power. The PWM circuit 52 receives the DC power from the rectifier/filter circuit 50 and pulse-width modulates the DC power to the one or more current-limiting circuits 54. In a preferred embodiment of the present invention, the PWM circuit 52 receives the DC power from the rectifier/filter circuit 50 and cyclically switches the DC power on and off to the one or more current-limiting circuits 54. The DC power is switched on and off by the PWM circuit 52 at a frequency which causes the white light emitted from the LEDs 22 to appear, when viewed with a "naked" human eye, to shine continuously. The PWM duty cycle can be adjusted or varied by control circuitry (not shown) to maintain the power consumption of the LEDs 22 at safe levels.

The DC power is modulated for several reasons. First, the DC power is modulated to adjust the brightness or intensity of the white light emitted from the LEDs 22 and, in turn, adjust the brightness or intensity of the white light emitted from the light tube 20. Optionally, the brightness or intensity of the white light emitted from the light tube 20 may be adjusted by a user. Second, the DC power is modulated to improve the illumination efficiency of the light tube 20 by capitalizing upon a phenomenon in which short pulses of light at high brightness or intensity to appear brighter than a continuous, lower brightness or intensity of light having the same average power. Third, the DC power is modulated to regulate the intensity of light emitted from the light tube 20 to compensate for supply voltage fluctuations, ambient temperature changes, and other such factors that affect the intensity of white light emitted by the LEDs 22. Fourth, the DC power is modulated to raise the variations of the frequency of light above the nominal variation of 120 to 100 Hz thereby reducing illumination artifacts caused by low frequency light variations, including interactions with video screens. Fifth, the DC power may optionally be modulated to provide an alarm function wherein light from the light tube 20 cyclically flashes on and off.

The one or more current-limiting circuits 54 receive the pulse-width modulated or switched DC power from the PWM circuit 52 and transmit a regulated amount of power to one or more arrays of LEDs 22. Each current-limiting circuit 54 powers a bank of one or more white LEDs 22. If a bank of LEDs 22 consists of more than one LED, the LEDs are electrically connected in series in an anode to cathode arrangement. If brightness or intensity variation between the LEDs 22 can be tolerated, the LEDs can be electrically connected in parallel.

The one or more current-limiting circuits 54 may include (1) a resistor, (2) a current-limiting semiconductor circuit, or (3) a switching power supply type current limiter.

Figure 6:
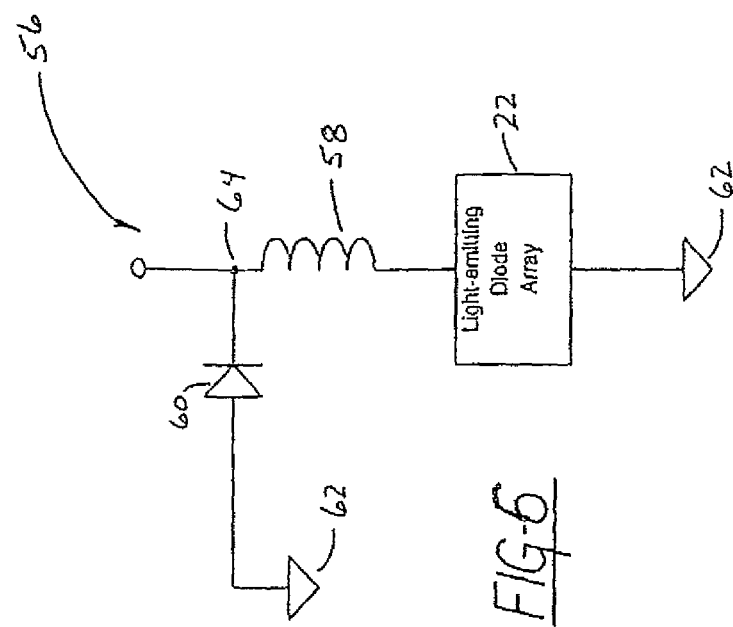
FIG. 6 is an electrical schematic of a switching power supply type current limiter.

FIG. 6 is an electrical schematic of a switching power supply type current limiter 56. The limiter 56 includes an inductor 58, electrically connected in series between the PWM circuit 52 and the array of LEDs 22, and a power diode 60, electrically connected between ground 62 and a PWM circuit/inductor node 64. The diode 60 is designed to begin conduction after the PWM circuit 52 is switched off. In this case, the value of the inductor 58 is adjusted in conjunction with the PWM duty cycle to provide the benefits described above. The switching power supply type current limiter 56 provides higher power efficiency than the other types of current-limiting circuits listed above.

Figure 7:
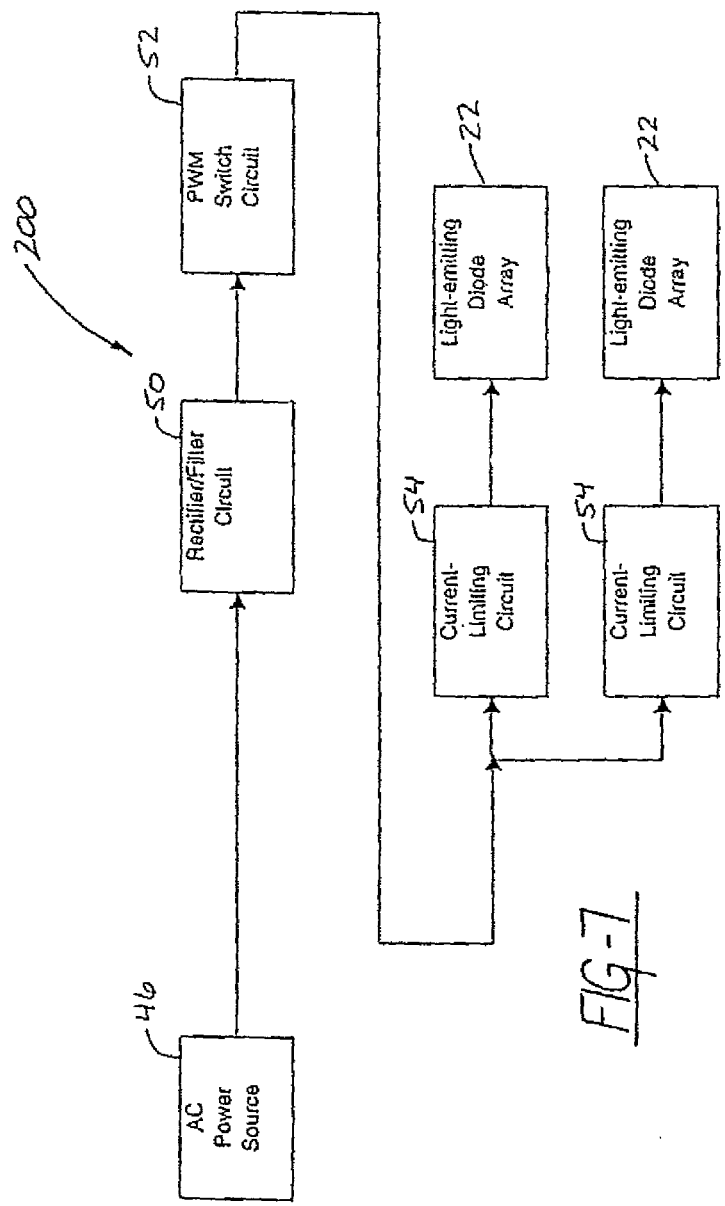
FIG. 7 is an electrical block diagram of a second power supply circuit for supplying power to the light tube.

FIG. 7 is an electrical block diagram of a second power supply circuit 200 for supplying power to the light tube 20. Similar to the first power supply circuit 100, the second power supply circuit 200 includes a conventional fluorescent light tube socket 40 having two electrical female connectors 42 disposed at opposite ends of the socket 40. Accordingly, a light tube 20 particularly adapted for use with the second power supply circuit 200 includes two end caps 26 and 28, each end cap having the form of an electrical male connector 44 which mates with a corresponding electrical female connector 42 in the socket 40.

In the second power supply circuit 200, the power source 46 supplies power directly to the rectifier/filter circuit 50. The rectifier/filter circuit 50, the PWM circuit 52, and the one or more current-limiting circuits 54 operate as described above to power the one or more arrays of LEDs 22. The rectifier/filter circuit 50, the PWM circuit 52, and the one or more current-limiting circuits 54 of the second power supply circuit 200 are preferably packaged inside the end caps 26 and 28 or the bulb portion 24 of the light tube 20 or inside the light tube socket 40.

Figure 8:
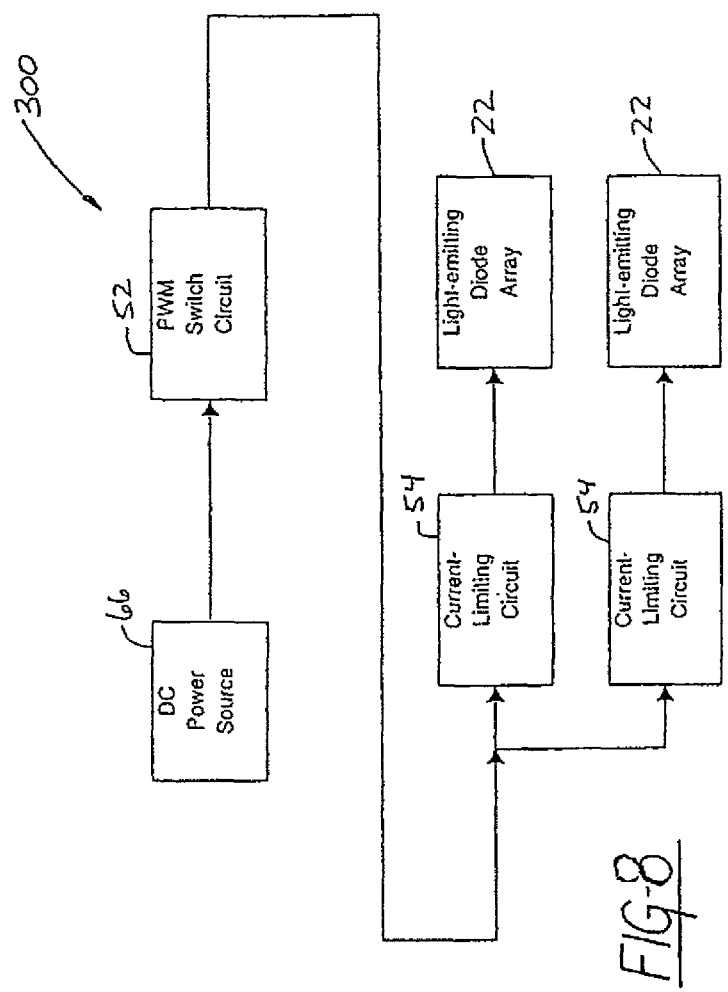
FIG. 8 is an electrical block diagram of a third power supply circuit for supplying power to the light tube.

FIG. 8 is an electrical block diagram of a third power supply circuit 300 for supplying power to the light tube 20. Similar to the first and second power supply circuits 100 and 200, the third power supply circuit 300 includes a conventional fluorescent light tube socket 40 having two electrical female connectors 42 disposed at opposite ends of the socket 40. Accordingly, a light tube 20 particularly adapted for use with the third power supply circuit 300 includes two end caps 26 and 28, each end cap having the form of an electrical male connector 44 which mates with a corresponding electrical female connector 42 in the socket 40.

The third power supply circuit 300 includes a DC power source 66, such as a vehicle battery. In the third power supply circuit 300, the DC power source 66 supplies DC power directly to the PWM circuit 52. The PWM circuit 52 and the one or more current-limiting circuits 54 operate as described above to power the one or more arrays of LEDs 22. In the third power supply circuit 300, the PWM circuit 52 is preferably packaged in physical location typically occupied by the ballast of a conventional fluorescent lighting system while the one or more current-limiting circuits 54 and LEDs 22 are preferably packaged inside the light tube 20, in either one of the two end caps 26 or 28 or the bulb portion 24.

Figure 9:
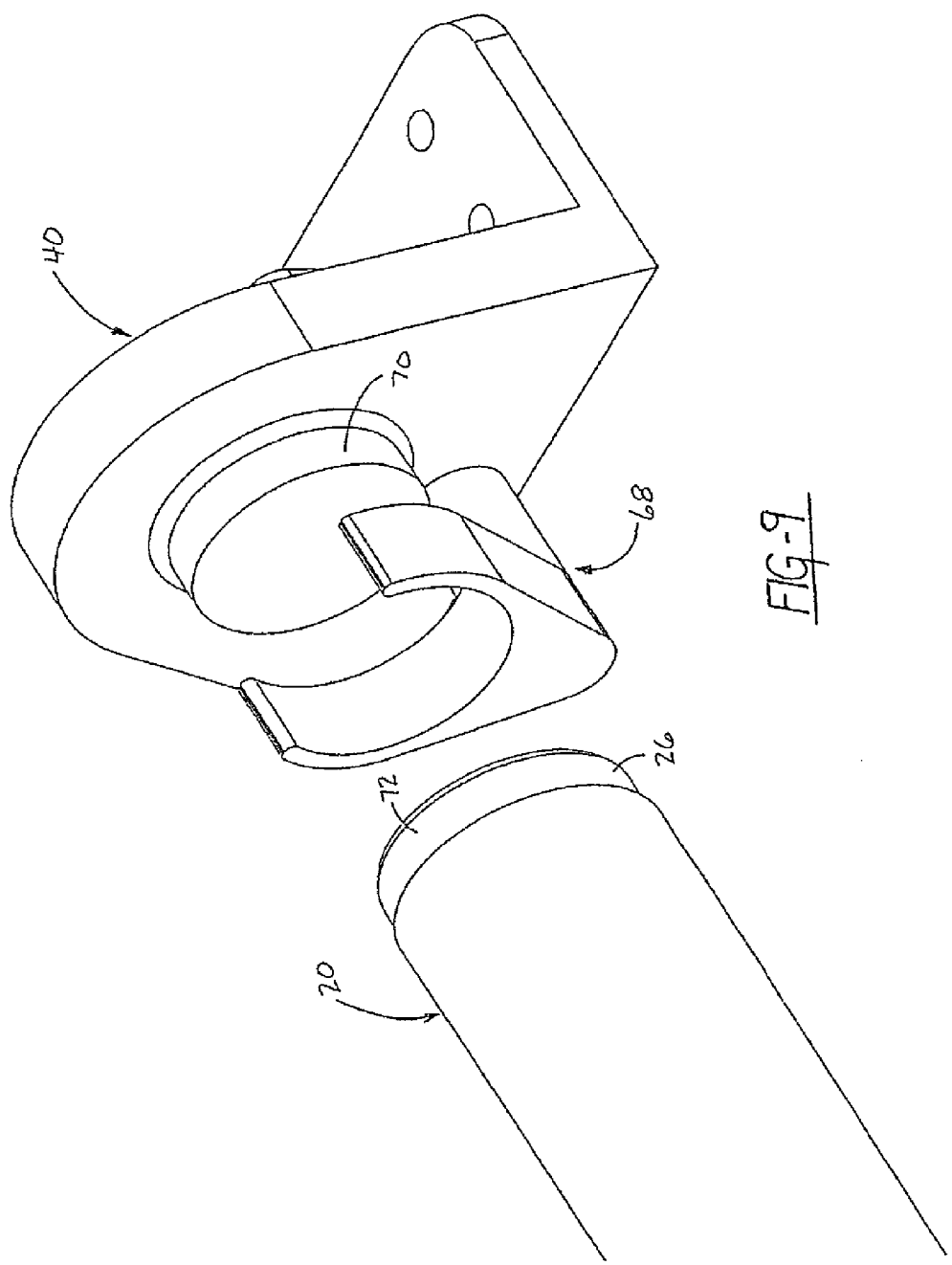
FIG. 9 is a fragmentary, perspective view of another embodiment of the present invention showing one end of the light tube disconnected from one end of the light tube socket.

FIG. 9 is a fragmentary, perspective view of another embodiment of the present invention showing one end of the light tube 20 disconnected from one end of the light tube socket 40. In this embodiment of the present invention, the light tube socket 40 includes a pair of brackets 68 and the light tube 20 includes a pair of end caps 26 and 28 which mate with the brackets 68.

Figure 10:
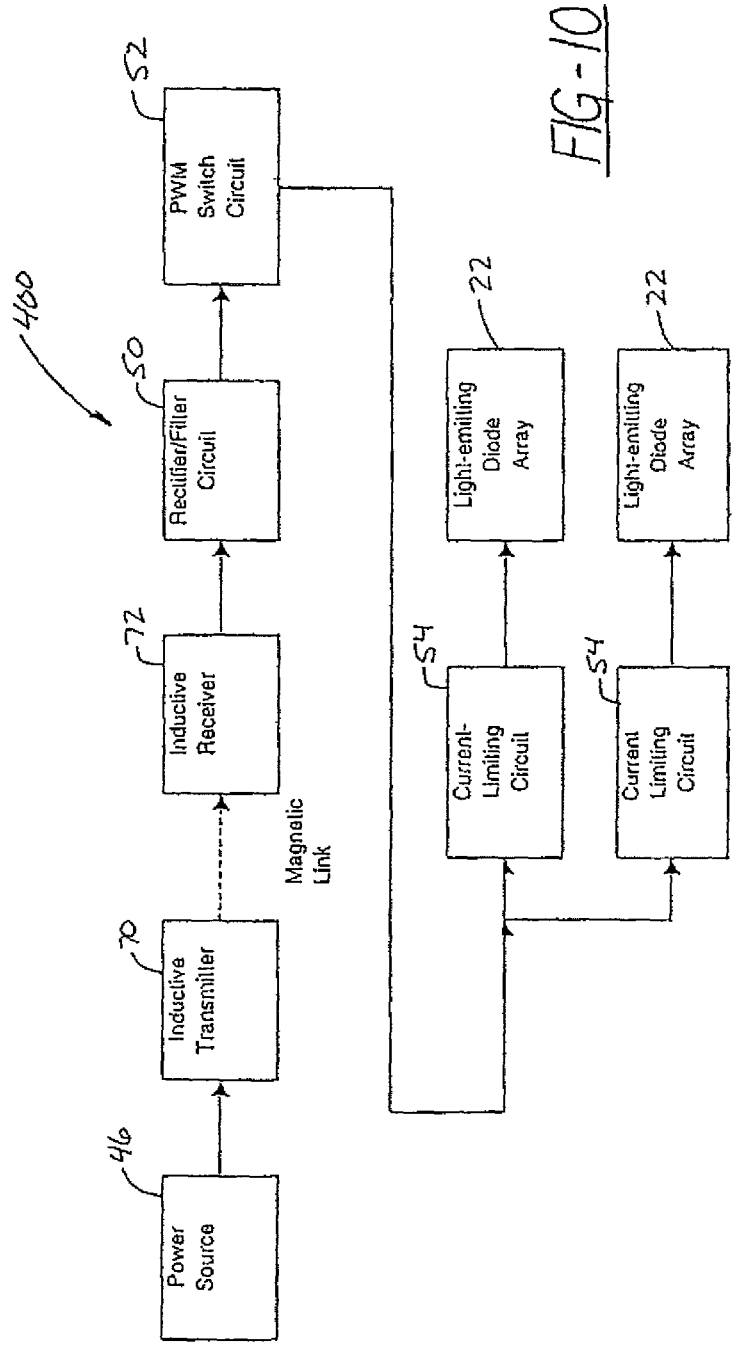
FIG. 10 is an electrical block diagram of a fourth power supply circuit for supplying power to the light tube.

FIG. 10 is an electrical block diagram of a fourth power supply circuit 400 for supplying power to the light tube 20. Unlike the first, second, and third power supply circuits 100, 200, and 300 which are powered through direct electrical male and female connectors 44 and 42, the fourth power supply circuit 400 is powered inductively. As such, the fourth power supply circuit 400 includes a light tube socket 40 having two brackets 68 disposed at opposite ends of the socket 40. At least one bracket 68 includes an inductive transmitter 70. Accordingly, a light tube 20 particularly adapted for use with the fourth power supply circuit 400 has two end caps 26 and 28 with at least one end cap including an inductive receiver or antenna 72. When the light tube 20 is mounted in the light tube socket 40, the at least one inductive receiver 72 in the light tube 20 is disposed adjacent to the at least one inductive transmitter 70 in the light tube socket 40.

The fourth power supply circuit 400 includes the power source 46 which supplies power to the at least one inductive transmitter 70 in the light tube socket 40. The at least one transmitter 70 inductively supplies power to the at least one receiver 72 in one of the end caps 26 and/or 28 of the light tube 20. The at least one inductive receiver 72 supplies power to the rectifier/filter circuit 50. The rectifier/filter circuit 50, PWM circuit 52, and the one or more current-limiting circuits 54 operate as described above to power the one or more arrays of LEDs 22. In this manner, the light tube 20 is powered without direct electrical connection.

What is claimed is:

1. A replacement light tube for replacing a fluorescent light tube, comprising:
    an elongate tubular housing having a first end and a second end;
    a first end cap and a second end cap disposed on the first end and the second end, respectively, each configured to fit with a socket for the fluorescent light tube;
    a rigid support structure having a planar portion having a first surface extending within the elongate tubular housing between the first end and the second end and having spaced-apart sidewalls extending away from the first surface and extending within the elongate tubular housing between the first end and the second end, at least a portion of the sidewalls in contact with an interior surface of the elongate tubular housing; and
    a plurality of white light emitting diodes supported by a second surface of the planar portion opposite to the first surface and between the first end and the second end, the plurality of white light emitting diodes arranged to emit light through the elongate tubular housing.

2. The replacement light tube of claim 1, wherein the sidewalls each have an outside surface facing the interior surface of the elongate housing and an inside surface opposite the outside surface and a substantially uniform cross-section along a length of the elongate tubular housing.

3. The replacement light tube of claim 2, wherein the planar portion is integral with the sidewalls, and the sidewalls are generally perpendicular to the planar portion.

4. The replacement light tube of claim 1, wherein the rigid support structure has a substantially uniform cross-section along a length of the elongate tubular housing.

5. The replacement light tube of claim 1, wherein the first surface extends in a plane within the elongate tubular housing, and wherein the sidewalls contact the interior surface of the elongate tubular housing away from the plane in which the first surface extends, the sidewalls being free from white light emitting diodes.

6. The replacement light tube of claim 1, wherein the planar portion, the sidewalls and the interior surface of the elongate tubular housing form a space extending between the first end and the second end.

7. The replacement light tube of claim 1, wherein the support structure divides the elongate tubular housing into a first space in which the plurality of light emitting diodes are housed and a second space defined by the planar portion, the sidewalls and the interior surface of the elongate tubular housing.

8. The replacement light tube of claim 1, further comprising:
    a power supply circuit configured to provide power to the plurality of light emitting diodes, at least a portion of the power supply circuit packaged inside the elongate tubular housing.

9. The replacement light tube of claim 8, wherein the power supply circuit comprises a pulse width modulator and a current limiter, the current limiter configured to receive power from the pulse width modulator and configured to transmit power to at least some of the plurality of light emitting diodes.

10. The replacement light tube of claim 9, wherein the current limiter comprises an inductive element electrically coupled between the pulse width modulator and the at least some of the plurality of light emitting diodes.

11. The replacement light tube of claim 9, wherein the current limiter and the pulse width modulator are packaged outside of the elongate tubular housing.

12. The replacement light tube of claim 9, wherein the pulse width modulator is configured to receive power from a power source and configured to regulate the intensity of light emitted from the plurality of light emitting diodes by cyclically switching the received power on and off according to a varying duty cycle.

13. The replacement light tube of claim 8, wherein the power supply circuit includes a rectifier configured to receive alternating current (AC) input and to provide direct current (DC) output.

14. The replacement light tube of claim 13, wherein the rectifier is arranged to provide the DC output to the pulse width modulator.

15. The replacement light tube of claim 8, wherein the power supply circuit includes a pulse width modulator that switches direct current (DC) power to the plurality of light emitting diodes on and off at a frequency such that the light emitted from the plurality of light emitting diodes appears, when viewed by a human eye, to shine continuously.

16. The replacement light tube of claim 1, wherein the plurality of light emitting diodes is arranged in spaced-apart banks of light emitting diodes such that a spacing between light emitting diodes in each bank is less than a spacing between centers of adjacent banks, each of the spaced-apart banks including more than one light emitting diode.

17. The replacement light tube of claim 1, wherein the first end cap and the second end cap comprise a respective pair of electrical bi-pin connectors.

18. The replacement light tube of claim 1, wherein the light emitting diodes are arranged as a plurality of groups spaced along an axis extending between the first end and second end, each group comprising light emitting diodes spatially displaced from each other in a direction orthogonal to the axis.

19. A replacement light tube for replacing a fluorescent light tube, comprising:
    an elongate tubular housing having a first end and a second end;
    a first end cap and a second end cap disposed on the first end and the second end, respectively, each configured to fit with a socket for the fluorescent light tube and comprising a respective pair of electrical bi-pin connectors;
    a rigid support structure having a planar portion having a first surface extending within the elongate tubular housing between the first end and the second end and having spaced-apart sidewalls extending away from the first surface and extending within the elongate tubular housing between the first end and the second end, at least a portion of the sidewalls in contact with an interior surface of the elongate tubular housing; and
    a plurality of white light emitting diodes supported by a second surface of the planar portion opposite to the first surface and between the first end and the second end, the plurality of white light emitting diodes arranged to emit light through the elongate tubular housing; wherein
    the support structure divides the elongate tubular housing into a first space in which the plurality of white light emitting diodes are housed and a second space defined by the planar portion, the sidewalls and the interior surface of the elongate tubular housing.

20. The replacement light tube of claim 19, further comprising:
    a power supply circuit including a pulse width modulator and a current limiter, the current limiter configured to receive power from the pulse width modulator and to transmit power to at least some of the plurality of light emitting diodes, at least a portion of the power supply circuit packaged inside the elongate tubular housing.

21. The replacement light tube of claim 20, wherein the current limiter comprises an inductive element electrically coupled between the pulse width modulator and the at least some of the plurality of light emitting diodes.

22. The replacement light tube of claim 20, wherein the current limiter and the pulse width modulator are packaged outside of the elongate tubular housing.

23. The replacement light tube of claim 20, wherein the power supply circuit includes a rectifier configured to receive alternating current (AC) input and to provide direct current (DC) output.

24. A replacement light tube for replacing a fluorescent light tube, comprising:
- an elongate tubular housing having a first end and a second end;
- a first end cap and a second end cap disposed on the first end and the second end, respectively, each configured to fit with a socket for the fluorescent light tube;
- a rigid support structure having a planar portion having a first surface extending within the elongate tubular housing between the first end and the second end and having spaced-apart sidewalls extending away from the first surface and extending within the elongate tubular housing between the first end and the second end, at least a portion of the sidewalls in contact with an interior surface of the elongate tubular housing;
- a plurality of white light emitting diodes supported by the first surface between the first end and the second end, the plurality of white light emitting diodes arranged to emit light through the elongate tubular housing; and
- a power supply circuit including a pulse width modulator and a current limiter, the power supply circuit being packaged within one of the end caps.

25. The replacement light tube of claim 24 wherein the rigid support structure has a substantially uniform cross-section along a length of the elongate tubular housing.

26. The replacement light tube of claim 24 wherein the first surface extends in a plane within the elongate tubular housing and wherein the sidewalls extend sufficiently far from the plane such that light emitted by the light emitting diodes is confined to an included angle of less than 180° by the sidewalls.

27. A replacement light tube for replacing a fluorescent light tube, comprising:
- an elongate tubular housing having a first end and a second end;
- a first end cap and a second end cap disposed on the first end and the second end, respectively, each configured to fit with a socket for the fluorescent light tube;
- a rigid support structure having a planar portion having a first surface extending within the elongate tubular housing between the first end and the second end and having spaced-apart sidewalls extending away from the planar portion and extending within the elongate tubular housing between the first end and the second end, at least a portion of the sidewalls in contact with an interior surface of the elongate tubular housing, the planar portion being integral with the sidewalls;
- a plurality of white light emitting diodes supported by the first surface between the first end and the second end, the plurality of white light emitting diodes arranged to emit light through the elongate tubular housing; and
- a power supply circuit including a pulse width modulator and a current limiter, at least a portion of the power supply circuit being packaged within the elongate tubular housing or one of the end caps.

28. The replacement light tube of claim 27, wherein the sidewalls extend from the first surface.

29. The replacement light tube of claim 27, wherein the sidewalls extend from a second surface of the planar portion, the second surface being opposite the first surface.

30. The replacement light tube of claim 27, wherein a portion of the power supply circuit is external to the elongate tubular housing and the first and second end caps.

* * * * *